(12) United States Patent
Lubomirsky et al.

(10) Patent No.: US 6,243,966 B1
(45) Date of Patent: Jun. 12, 2001

(54) AIR AMPLIFIER WITH UNIFORM OUTPUT FLOW PATTERN

(75) Inventors: Dmitry Lubomirsky, Cupertino; Edward Floyd, Santa Clara, both of CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/467,090

(22) Filed: Dec. 10, 1999

(51) Int. Cl.⁷ .................................................. F26B 19/00
(52) U.S. Cl. ........................... 34/62; 34/84; 34/218; 118/715
(58) Field of Search .................. 34/62, 65, 74, 34/83, 84, 218, 232, 233; 118/715, 725

(56) References Cited

U.S. PATENT DOCUMENTS 5,843,233 * 12/1998 Van De Ven et al. ............ 118/715
6,099,650 * 8/2000 Carbonaro et al. ............... 118/715

* cited by examiner

*Primary Examiner*—Pamela Wilson
(74) *Attorney, Agent, or Firm*—Ostroff & Associates

(57) ABSTRACT

An air amplifier device has a body with two pieces which fit together and have an inner wall defining a generally cylindrical cavity with a center axis and with an entrance opening at its upper end and an exit opening at its other end. The two pieces have respective shoulders which abut to index the pieces in precise relationship radially, axially, and longitudinally. A pair of circular lips in the inner wall near the entrance opening form a venturi jet air opening through the inner wall to direct a controlled flow of air from a supply of air down into the cylindrical cavity. The lips are uniformly parallel with each other and concentric with the center axis, are closely and uniformly spaced apart for 360 degrees around their lengths and are two circular edges of the respective pieces, and are indexed to the respective shoulders of the pieces such that when the pieces are assembled the jet air opening is uniform within a fraction of a thousandth of an inch.

7 Claims, 2 Drawing Sheets

AIR AMPLIFIER WITH UNIFORM OUTPUT FLOW PATTERN

FIELD OF THE INVENTION

This invention relates to a mechanical device utilizing a venturi effect for amplifying flow of air there through, and more particularly, to an air amplifier device having an output air flow of high uniformity and which is accurately aligned with the axis of the device.

BACKGROUND OF THE INVENTION

Semiconductor processing equipment chambers have walls which during certain processing steps need to be cooled. Existing methods of providing such cooling include circulating chilled water through pipes in contact with the chamber walls and of blowing of air against an exterior surface or surfaces of the walls. These cooling methods and arrangements are relatively complex and costly, and in some instances required periodic maintenance which caused down-time of the equipment which adds to the costs of manufacturing.

An air amplifier which utilize a venturi effect and has no moving parts is commercially available from the TRTX Co. of Cincinnati, Ohio. However, prior-art devices of this kind fail to provide an output pattern of air flow of sufficient uniformity to be fully suitable for use in cooling the exteriors of walls of processing chambers of semiconductor manufacturing equipment. The cooling of such walls should be as uniform and even as possible in order to prevent hot spots and temperature variations.

It is desirable an air amplifying device provide cooling air directed over and upon the walls of semiconductor processing chambers which has a uniform flow pattern accurately aligned relative to the chamber in order to provide even temperature distributions.

SUMMARY OF THE INVENTION

In accordance with the present invention there is provided a device for amplifying a flow of air. The device utilizes a venturi effect and has an output air flow pattern with improved uniformity and more precise alignment. This improved device comprises a body with an inner, cylindrical wall defining a relatively large, central cavity extending down along an axis. At one end of this cavity there is an entrance opening for sucking atmospheric air into and axially down through the device. At the other end of the cavity there is an exit opening from which the air is discharged in a uniform and precisely aligned pattern and with an "amplified" flow rate. Located within the cavity near the entrance opening is an annular venturi opening which passes through the inner wall of the device from the central cavity to an enclosed air chamber behind the wall. The venturi opening is very precisely formed and dimensioned by an upper circular lip and a lower parallel lip. These lips are closely spaced apart from each other in the axial direction, and are formed by edges at a cut through the inner wall. The lips lie closely parallel to each other and slope somewhat downward and inward toward the center cavity. The venturi opening defined by these lips is made dimensionally highly uniform for 360 degrees around their lengths which are concentric with the center axis. This venturi opening directs a set stream of controlled air at relatively high velocity downward into the central cavity, which stream by venturi action sucks a much larger volume of air from the outside atmosphere into the entrance opening of the device. The controlled stream of air is provided by pressurized clean, dry air pumped into the enclosed air chamber from an external source. This produces an overall "amplified" stream of air at the exit opening of the device having a flow rate (measured in standard cubic feet per minute) many times (e.g., twenty times) the flow rate of the controlled air stream. The near perfect uniformity of the air stream exiting from the device is such that, by way of example, temperature variation at selected points around the wall of a processing chamber is only about 1° C. compared to variations of as much as 15° C. with prior art air amplifier devices. The device provided by the present invention is advantageously made as two generally cylindrical pieces which telescope together and which have abutting shoulders which index and hold them in precise dimensional relationship. This in turn insures that the venturi opening of the assembled device is perfectly uniform (or nearly so) for 360 degrees around the periphery of the central cavity and results in an "amplified" air flow from the device of precise alignment and uniformity.

Viewed from a first aspect, the present invention is directed to an air amplifier device. The devices comprises a body having a first inner wall defining a generally cylindrical cavity having a center axis and an entrance opening at a first end thereof and an exit opening at a second end thereof. The body defines a pair of separated circular lips having first ends which intersect the inner wall near the entrance opening and form a venturi jet opening through the inner wall. The lips are uniformly parallel with each other and concentric with the center axis and being closely and uniformly spaced apart for 360 degrees around their lengths. The body defines a channel there through which has first and second ends with the first end thereof being in communication with second ends of the lips. The channel is adapted to allow air under pressure to flow into the first end thereof and there through and then into the jet air opening such that a jet of controlled air flows evenly through the jet opening and sucks atmospheric air into the entrance opening of the device and results in a highly uniform amplified flow of air out from the exit opening of the device.

Viewed from a first aspect, the present invention is directed to an air amplifier device. The devices comprises a body having two pieces fastened together and having a first inner wall defining a generally cylindrical cavity having a center axis and an entrance opening at a first end thereof and an exit opening at a second end thereof. The two pieces have respective shoulders which abut to index the pieces in precise relationship radially, axially, and longitudinally. The body defines a pair of separated circular lips having first ends which intersect the inner wall near the entrance opening and form a venturi jet opening through the inner wall. The lips are uniformly parallel with each other and concentric with the center axis and are closely and uniformly spaced apart for 360 degrees around their lengths. The lips are a circular edge of each of the two pieces and are indexed to the respective shoulders of the pieces such that when the pieces are assembled the jet air opening is uniform within a fraction of a thousandth of an inch. The body defines a channel there through which has first and second ends with the first end thereof being in communication with second ends of the lips. The channel is adapted to allow air under pressure to flow into the first end thereof and there through and then into the jet air opening such that a jet of controlled air flows evenly through the jet opening and sucks atmospheric air into the entrance opening of the device and results in a highly uniform amplified flow of air out from the exit opening of the device.

A better understanding of the invention together with a fuller appreciation of its many advantages will best be gained from a study of the following description given in conjunction with the accompanying drawings and claims.

DETAILED DESCRIPTION

Figure 1:
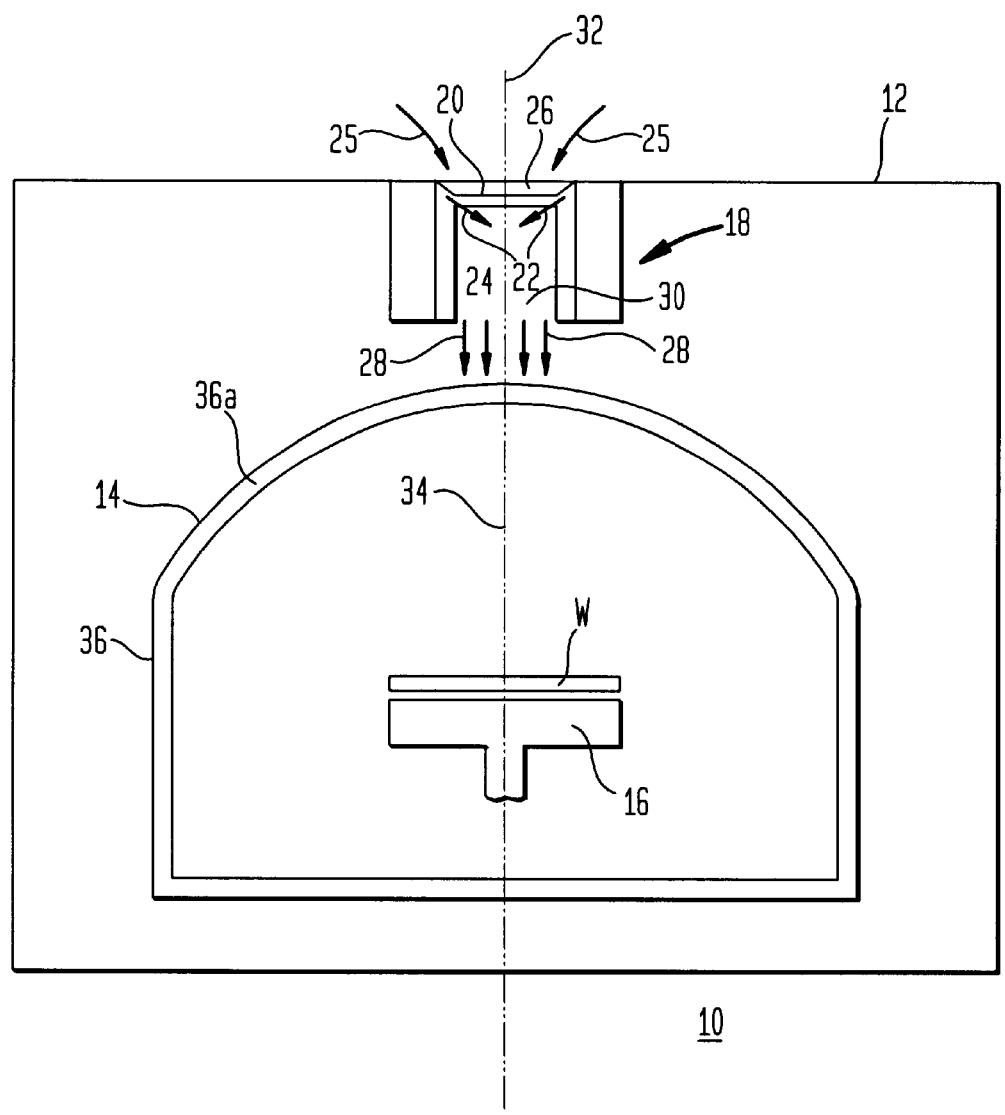
FIG. 1 is a schematic illustration of a cross section of a portion of semiconductor wafer processing equipment together with an air amplifier device in accordance with the present invention for cooling interior portions of the equipment.

Referring now to FIG. 1, there is shown a schematic illustration of a cross sectional view of a portion of an equipment 10 for manufacturing semiconductors which includes an air amplifier device 18 in accordance with the present invention. The equipment 10 comprises a housing 12, a processing chamber 14 which is defined by a wall 36 having a rounded top portion 36a, and a semiconductor wafer holder 16. For illustrative purposes a semiconductor wafer W shown supported on holder 16. The air amplifier device 18, described in greater detail hereinafter, has an annular venturi opening 20 which directs an annular air jet of controlled air, indicated by arrows 22, of relatively high velocity downward into a central cavity 24 of the device 18. This jet of controlled air 22 sucks outside air, indicated by arrows 25, into the device 18 at a funnel-like entrance opening 26 and directs an "amplified" air stream, indicated by arrows 28, downward through the cavity 24 and out from an exit opening 30 in the lower end of the device 18. A center axis 32 of the device 18 is aligned with a vertical axis 34 of the chamber 14. By virtue of the invention the air stream 28 is highly uniform and flows parallel to the axis 32 evenly down upon and then over the top rounded portion 36a of wall 36 and then around the rest of wall 36. The air stream 28, after cooling the wall 36, exits the housing 12 through vents (not shown). The equipment 10 also includes other elements (not shown) which are well known in the art and not described herein.

Figure 2:
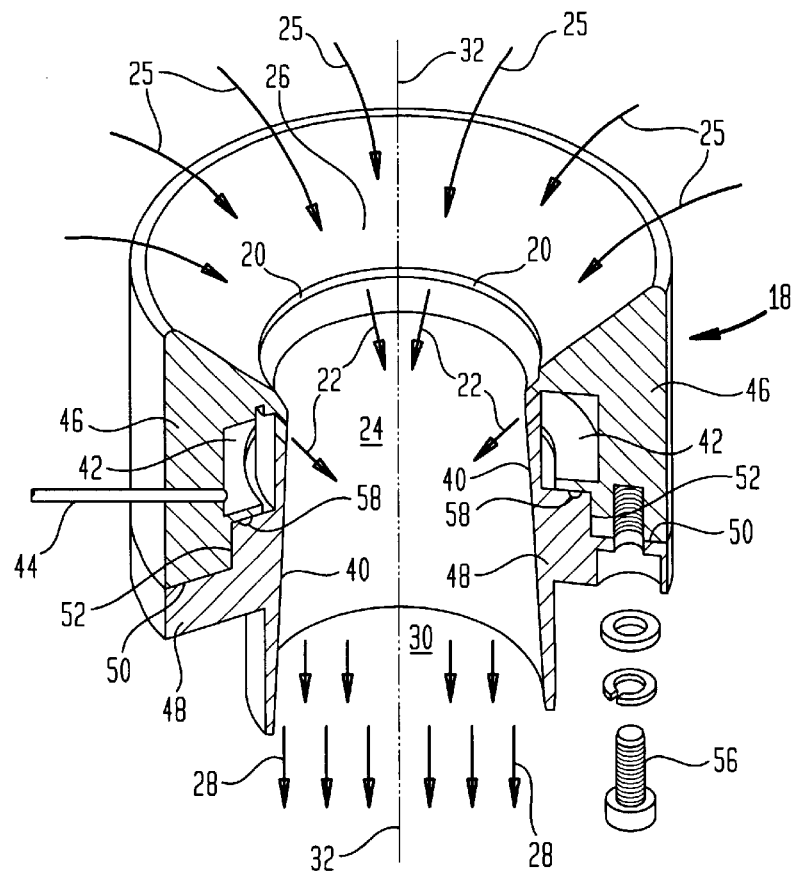
FIG. 2 is a partially broken away three dimensional view, partly in cross-section of the air amplifier device of FIG. 1.

Referring now to FIG. 2, there is shown by itself a three dimensional cut away view of the air amplifier device 18 which is in accordance with the present invention. The central cavity 24 of the device, which is defined by an inner wall 40, is cylindrical with its axis congruent with the axis 32 of the device 18. Enclosed behind a thin portion of the wall 40 within the body of the device 18 is a small cylindrical chamber 42 into which compressed air is pumped via an inlet pipe 44 from a source (not shown). Located near the top of this chamber 42 is the venturi opening 20 through which the jet of controlled air 22 at suitable velocity is directed down into the central cavity 24. Additional details of the venturi opening 20 are described hereinbelow.

The device 18 is advantageously made of two cylindrical pieces 46 and 48 which fit together, with the piece 46 surrounding a portion of the piece 48 as is shown in FIG. 2. The two pieces 46 and 48 abut each other at a horizontal shoulder surface 50 and a vertical shoulder surface 52. These interfacing surfaces 50 and 52 very accurately and precisely index the two pieces 46 and 48 of the device 18 radially, axially and longitudinally relative to each other. This insures that the venturi opening 20 is properly aligned with and evenly spaced in width for 360 degrees around the axis 32 of the central cavity 24. The two pieces 46 and 48 are rigidly fastened to each other by a suitable number (e.g., three) of angularly spaced washers and bolts 56 (only one set of which is shown). Thus the pieces 46 and 48 can be readily assembled with great accuracy, and subsequently, if necessary, disassembled and re-assembled with equal accuracy. When the pieces 46 and 48 are bolted together the lips forming the venturi opening 20 are precisely and evenly aligned relative to each other and the central cavity 24 thereby insuring that the amplified air flow 28 through the device 18 is highly uniform and properly aligned (i.e., parallel) relative to its axis 32 and the axis 34 of the processing chamber 14 (see FIG. 1). The air chamber 42 is formed by a cylindrical cut into the piece 46. The pieces 46 and 48 can be made of a suitable aluminum alloy machined with great accuracy by precision tooling well known in the art. To prevent air flow from the chamber 42 at the interfacing shoulder surfaces 50 and 52, a circular O-ring 58 is placed between the pieces 46 and 48 and is compressed when the pieces 46 and 48 are bolted together, as is shown in FIG. 2. Compressed air pumped into the chamber 42 via the pipe 44 leaves the chamber 42 only through the venturi opening 20 located near its top.

Figure 3:
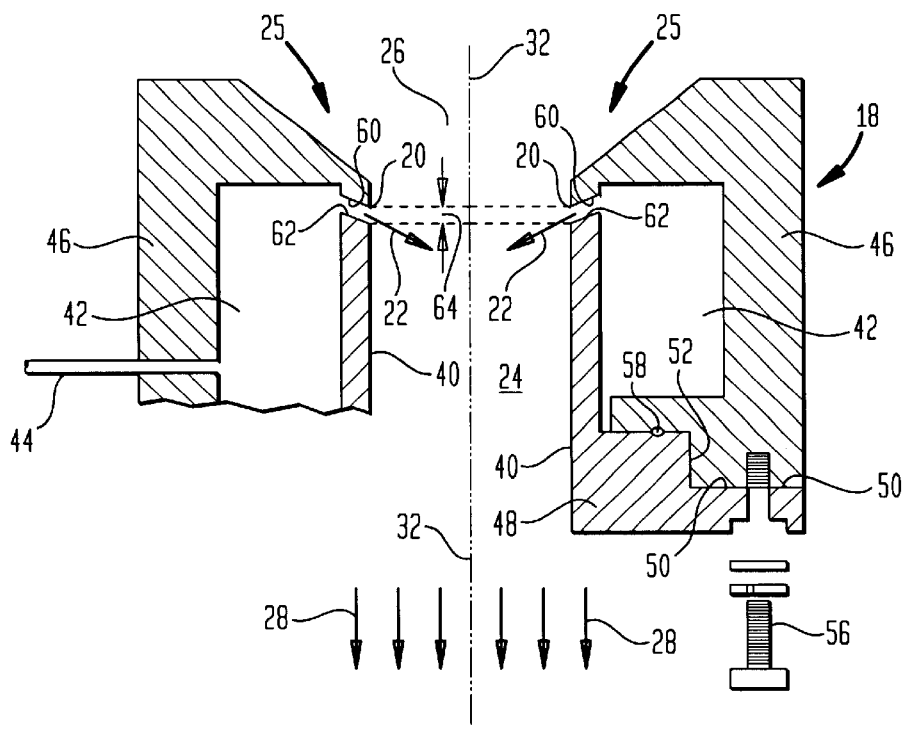
FIG. 3 is an enlarged cross-section of a portion of the air amplifier device of FIG. 2 showing a venturi opening formed by opposing lips cut through an inner wall of the amplifier device.

Referring now to FIG. 3, there is schematically shown an enlarged cross-section view of a portion of the device 18 showing details of the venturi opening 20. Opening 20 is formed by an upper lip 60 and a lower lip 62 parallel to it and spaced in the longitudinal direction (i.e., parallel to the axis 32) by a small uniform width, indicated by arrows at 64, for 360 degrees around the circular lengths of the lips. The lips 60 and 62 are formed by respective edges of the upper piece 46 and the lower piece 48 of the device 18. These edges (lips 60 and 62) slope at a suitable angle downward and inward toward the axis 32 and are precisely referenced to the shoulder surfaces 50 and 52 where the pieces 46 and 48 abut each other. Thus the venturi opening 20 is held exactly even and uniform for 360 degrees around the axis 32 when the pieces 46 and 48 are assembled (or reassembled).

By way of example, the venturi opening 20 may have a design width (indicated by arrows 64) of 0.002 inch with a tolerance or dimensional variation of not more than 0.0003 inch. A jet flow of controlled air 22 through the venturi opening 20 into the central cavity 24 can produce an amplified flow of air (i.e., the flow 28) through the device 18 of 450 standard cubic feet per minute, or about 20 times the flow rate of the controlled air flow 22. Thus the source (not shown) of compressed air to the chamber 42 need supply via the pipe 44 only a relatively small amount of air. Temperature variations on the outer surface of the wall 36 of the processing chamber 14 (FIG. 1) at measured points along a circle concentric with the axis 34 were 360 degrees. This compares with variations 15 times greater in the case of a prior art air amplifier device in which the uniformity and evenness of the flow of air of a venturi opening were not adequately controlled.

The above description is intended in illustration and not in limitation of the invention. Various minor changes in the embodiment illustrated may occur to those skilled in the art and can be made without departing from the spirit or scope of the invention as set forth in the accompanying claims. For example, means other than bolts can be used to fasten together the pieces of the device, and materials, dimensions and flow rates different from those specifically described herein may be used.

What is claimed is:

1. An air amplifier device comprising:

a body having a first inner wall defining a generally cylindrical cavity having a center axis and an entrance opening at a first end thereof and an exit opening at a second end thereof;

the body defining a pair of separated circular lips having first ends which intersect the inner wall near the entrance opening and form a venturi jet opening through the inner wall, the lips being uniformly parallel with each other and concentric with the center axis and being closely and uniformly spaced apart for 360 degrees around their lengths; and the body defining a channel there through which has first and second ends with the first end thereof being in communication with second ends of the lips, the channel being adapted to allow air under pressure to flow into the first end thereof and there through and then into the jet air opening such that a jet of controlled air flows evenly through the jet opening and sucks atmospheric air into the entrance opening of the device and results in a highly uniform amplified flow of air out from the exit opening of the device.

2. The device of claim 1 wherein the channel is in communication with the second ends of the lips through a chamber which is defined by a second inner wall of the body.

3. The device of claim 1 wherein the body of the device is comprised of a plurality of pieces which have respective shoulders which interface to index the pieces in precise relationship radially, axially and longitudinally, the circular lips being narrow edges of respective pieces, the lips being indexed to the respective shoulders of the pieces such that when the pieces are assembled the jet air opening is uniform and properly aligned with the center axis.

4. The device of claim 3 wherein the body of the device comprises two pieces which telescope together, the respective shoulders of the pieces interfacing over horizontal and vertical surfaces.

5. The device of claim 4 further comprising fasteners for coupling the pieces together such that they can be assembled with the desired accuracy and disassembled and reassembled with equal accuracy.

6. An air amplifier device comprising:

a body comprised of two pieces fastened together having a first inner wall defining a generally cylindrical cavity having a center axis and an entrance opening at a first end thereof and an exit opening at a second end thereof, the two pieces having respective shoulders which abut to index the pieces in precise relationship radially, axially, and longitudinally;

the body defining a pair of separated circular lips having first ends which intersect the inner wall near the entrance opening and form a venturi jet opening through the inner wall, the lips being uniformly parallel with each other and concentric with the center axis and being closely and uniformly spaced apart for 360 degrees around their lengths, the lips being a circular edge of each of the two pieces, the lips being indexed to the respective shoulders of the pieces such that when the pieces are assembled the jet air opening is uniform within a fraction of a thousandth of an inch; and the body defining a channel there through which has first and second ends with the first end thereof being in communication with second ends of the lips, the channel being adapted to allow air under pressure to flow into the first end thereof and there through and then into the jet air opening such that a jet of controlled air flows evenly through the jet opening and sucks atmospheric air into the entrance opening of the device and results in a highly uniform amplified flow of air out from the exit opening of the device.

7. The device of claim 6 wherein the two pieces are fastened together by removable fasteners.

* * * * *